United States Patent [19]

Turner et al.

[11] Patent Number: 5,272,368
[45] Date of Patent: Dec. 21, 1993

[54] COMPLEMENTARY LOW POWER NON-VOLATILE RECONFIGURABLE EECELL

[75] Inventors: John E. Turner, Santa Cruz; Richard G. Cliff, Santa Clara, both of Calif.

[73] Assignee: Altera Corporation, San Jose, Calif.

[21] Appl. No.: 698,084

[22] Filed: May 10, 1991

[51] Int. Cl.⁵ .............................................. G11C 11/34
[52] U.S. Cl. ................................ 257/315; 365/189.05; 365/189.09; 365/185
[58] Field of Search .............. 365/185, 189.05, 189.08, 365/189.09; 257/315

[56] References Cited

U.S. PATENT DOCUMENTS

| | | | |
|---|---|---|---|
| 4,858,185 | 8/1989 | Kowshik et al. | 365/185 |
| 5,047,814 | 9/1991 | Hazani | 365/185 |
| 5,101,378 | 3/1992 | Radjy et al. | 365/185 |

Primary Examiner—William Mintel
Assistant Examiner—Roy Potter
Attorney, Agent, or Firm—Jeffrey H. Ingerman; Robert W. Morris

[57] ABSTRACT

A non-volatile CMOS electrically erasable programmable memory cell for configuring a PLD is disclosed. A CMOS inverter is formed by fabricating an n-channel MOSFET and a p-channel MOSFET with merged floating gate regions. A tunnel capacitor allows charge to be supplied to or removed from the floating gate. The floating gate provides non-volatile charge storage. The CMOS inverter senses the presence or absence of charge on the floating gate and provides an amplified inverted output. The CMOS inverter consumes very low power and provides rail-to-rail output voltage swings.

15 Claims, 2 Drawing Sheets

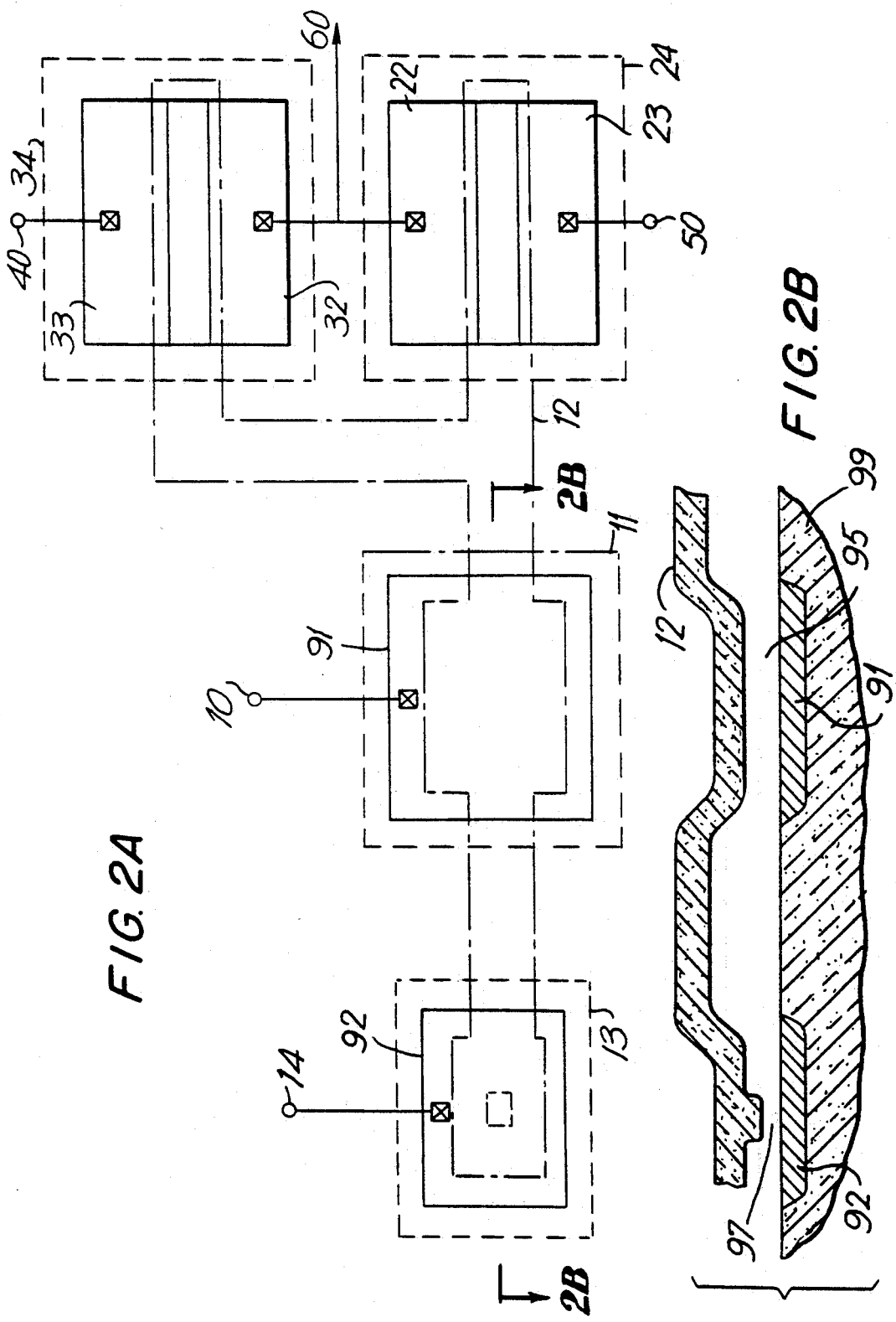

COMPLEMENTARY LOW POWER NON-VOLATILE RECONFIGURABLE EECELL

BACKGROUND OF THE INVENTION

This invention relates to the configuration of programmable logic devices (PLDs). More particularly, the invention relates to a non-volatile electrically erasable CMOS memory cell for configuring a PLD.

A PLD is configured by programming floating gate memory cells, such as read only memory (ROM) cells, contained in a programmable array. The programmed or unprogrammed state of the memory cell is used to control whether a connection between logic elements is closed or open. Complicated sensing and amplification circuitry is required to distinguish the difference between a programmed and an unprogrammed cell, and to convert this into a voltage output swing large enough to be detected. Sensing circuitry necessary to detect such small swings occupies significant space on the die and uses substantial power, thus limiting the space and power available for other purposes.

In view of the foregoing it would be desirable to be able to provide an improved configuration cell which eliminates complicated sensing circuitry.

It would further be desirable to be able to provide an improved configuration cell in which the output voltage swings from rail to rail.

It would still further be desirable to be able to provide an improved configuration cell which utilizes essentially zero power when not switching.

It would still further be desirable to be able to provide an improved configuration cell which occupies a smaller space on the die.

It would still further be desirable to be able to provide an electrically erasable configuration cell.

It would still further be desirable to be able to provide an improved configuration cell in which the cell's ability to retain charge can be margin verified.

SUMMARY OF THE INVENTION

It is an object of this invention to provide an improved configuration cell which eliminates complicated sensing circuitry.

It is a further object of this invention to provide an improved configuration cell in which the output voltage swings from rail to rail.

It is a still further object of this invention to provide an improved configuration cell which utilizes essentially zero power when not switching.

It is a still further object of this invention to provide an improved configuration cell which occupies a smaller space on the die.

It is a still further object of this invention to provide an electrically erasable configuration cell.

It is a still further object of this invention to provide an improved configuration cell in which the cell's ability to retain charge can be margin verified.

In accordance with this invention, there is provided a non-volatile CMOS electrically erasable and programmable configuration cell. Two complementary MOS transistors sense the presence or absence of charge stored on a floating gate, and provide an output representative of the state of the floating gate. The floating gate is charged and discharged via electron transfer through a tunnel capacitor. A control gate, separated from the floating gate by a capacitor, provides a means for establishing a reference voltage for the cell. A first pass transistor gated by a write select signal provides a means for coupling a write signal to the tunnel capacitor. A second pass transistor, gated by a verify select signal, provides a means for coupling the output of the two MOS transistors to a verify line.

BRIEF DESCRIPTION OF THE DRAWINGS

The above and other objects and advantages of this invention will be apparent on consideration of the following detailed description, taken in conjunction with the accompanying drawings, in which like reference characters refer to like parts throughout, and in which:

FIG. 2A is a top view of an embodiment of the present invention; and

FIG. 2B is a cross-sectional view of an embodiment of the capacitor and the tunnel capacitor of the invention, taken from line 2B—2B of FIG. 2A.

DETAILED DESCRIPTION OF THE INVENTION

Figure 1:
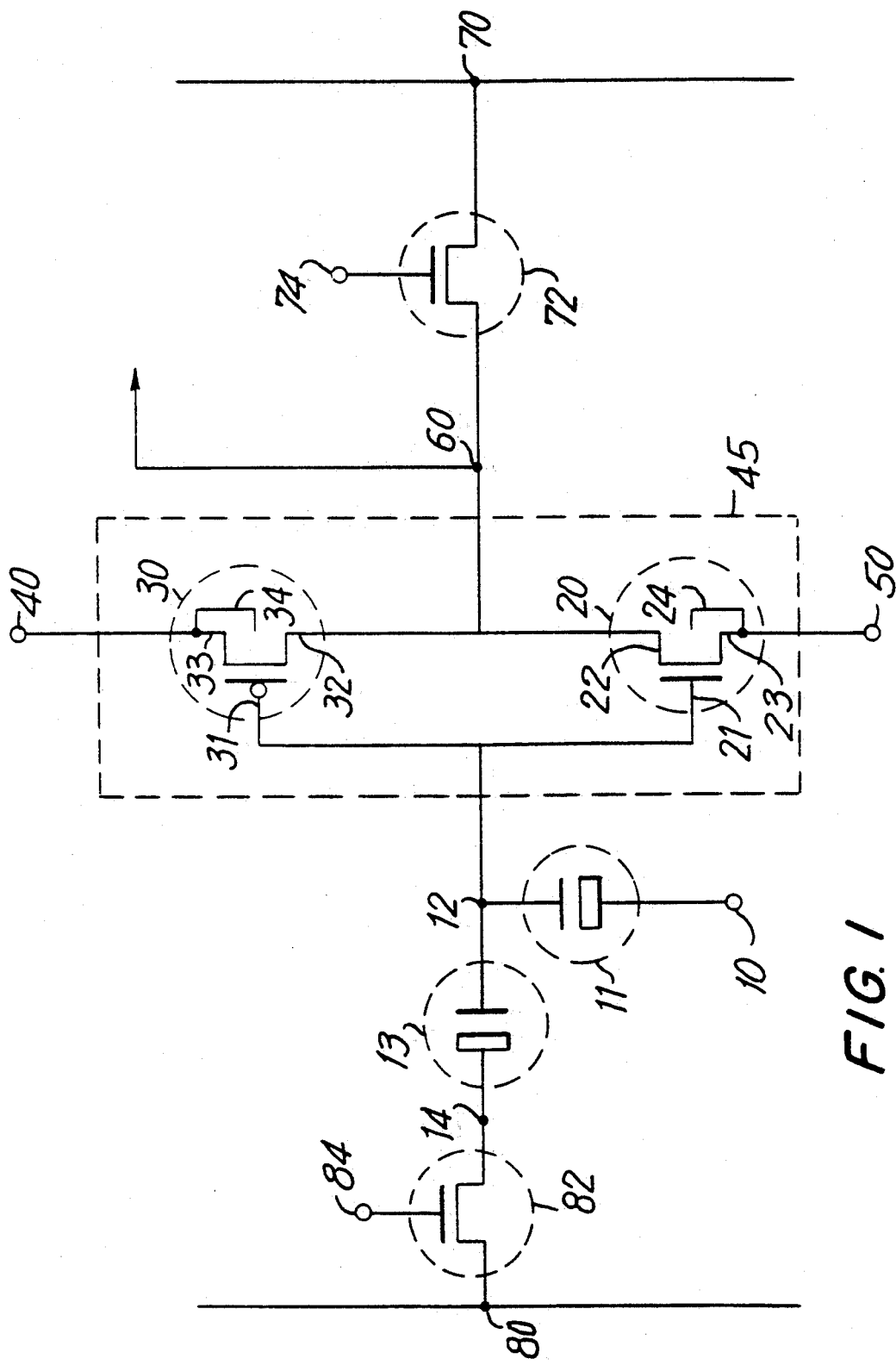
FIG. 1 is a schematic diagram of an illustrative embodiment of the invention.

This invention provides a non-volatile CMOS electrically erasable programmable memory cell (EEcell) for configuring a PLD. A CMOS inverter is formed by fabricating an n-channel MOSFET and a p-channel MOSFET with merged polysilicon floating gate regions. A capacitor coupled to the merged floating gate provides a control gate for the EEcell. A tunnel capacitor is provided to charge and discharge the merged floating gate. A write select signal applied to the gate of a pass transistor controls programming and erasing the floating gate via the tunnel capacitor. The CMOS inverter senses the presence or absence of charge on the floating gate and provides an amplified inverted output. The CMOS inverter utilizes very low power and provides rail-to-rail voltage swings. A verify select signal applied to the gate of a second pass transistor provides a means for verifying the state of the EEcell.

FIG. 1 shows a schematic diagram of a preferred embodiment of the complementary low power non-volatile reconfigurable electrically erasable and programmable cell (EEcell). An n-channel MOSFET 20, having a floating gate 21, a drain 22, and a source 23 and a p-channel MOSFET 30, having a floating gate 31, a drain 32 and a source 33 are fabricated according to known techniques on a single silicon substrate. The n-channel MOSFET 20 requires a p-type substrate and the p-channel MOSFET 30 requires an n-type substrate. As is known in the art, n-channel and p-channel MOS devices may be fabricated on the same silicon substrate by the use of tubs or wells. In a single-well process, n-type impurities are diffused into a silicon substrate to form an n-type substrate, and then p-type impurities are diffused into a region within the n-type substrate to form a p-well. The process is reversed to form an n-well. A more preferred embodiment provides a twin-well process, wherein both a p-well and an n-well region are formed. N-channel MOSFET 20 is formed within a p-well substrate and p-channel MOSFET 30 is formed within n-well substrate. The substrate of n-channel MOSFET 20 is connected to source 23 as depicted by source-to-substrate connection 24. The substrate of p-channel MOSFET 30 is connected to source 33 as depicted by source-to-substrate connection 34.

The n-channel MOSFET 20 and the p-channel MOSFET 30 are connected to form a CMOS inverter 45.

Floating gate 21 and floating gate 31 are merged to form a merged floating gate 12. Floating gate 12 is fabricated as a layer of polycrystalline silicon (polysilicon), according to known techniques. Drain 22 is connected to drain 32 to form a merged drain, designated as the output node 60. The source 33 of the p-channel device is coupled to a first voltage source through node 40. The source 23 of the n-channel device is coupled to a second voltage source through node 50.

A capacitor 11 separates floating gate 12 from a control gate 10. The capacitor 11 may be formed according to known techniques by controlling the thickness of the oxide layer, typically approximately 200 Å in the present embodiment, between the polysilicon of floating gate 12 and a first n-doped region 91 of substrate 99 into which impurities have been introduced. A variety of materials, including phosphorus and arsenic can be used for the implant. In a particularly preferred embodiment, phosphorus and arsenic are implanted via an ion implantation process to achieve an impurity concentration of approximately $10^{18}/cm^3$.

A tunnel capacitor 13 separates floating gate 12 from a write node 14. The tunnel capacitor 13 may be formed by controlling the thickness of the oxide between the polysilicon of floating gate 12 and a second implanted region 92—typically approximately 80 Å in the present embodiment.

A pass transistor 72, which is an n-channel MOS device in a preferred embodiment, is fabricated according to well known methods. A verify select signal applied to verify select node 74 (which is the gate of pass transistor 72) controls coupling of the output node 60 to a verify line 70.

A pass transistor 82, which is an n-channel MOS device in a preferred embodiment, is fabricated according to well known methods. A write select signal applied to write select node 84 (which is the gate of pass transistor 82) controls coupling of a write line 80 to the write node 14.

FIG. 2A is a top view illustrating the layout on a silicon substrate of an embodiment of the present invention. N-channel MOSFET 20 and p-channel MOSFET 30 are fabricated in adjacent wells 24, 34, on a silicon substrate, with drain 22 coupled to drain 32 and to output node 60. Floating gate 12 is formed as a layer of polysilicon disposed over the channel regions of n-channel MOSFET 20 and p-channel MOSFET 30 and further extended to form one side of capacitor 11 and one side of tunnel capacitor 13.

Referring to FIG. 2B, a first n-doped region 91 is formed in the silicon substrate 99 by using known techniques. Region 91 is separated from floating gate 12 by oxide 95. The capacitance of capacitor 11 is determined by the thickness of oxide 95—approximately 200 Å in this embodiment—and by the concentration of impurities introduced into region 91. The oxide thickness and the impurity concentrations can be varied and still achieve a satisfactory capacitance. An embodiment of the invention utilizes a capacitance of 2 fF/$\mu m^2$. As is known to those skilled in the art, impurities can be introduced into first n-doped region 91 by ion implantation or by diffusion, however, the ion implantation technique is a more preferred embodiment, because it provides greater doping accuracy.

Tunnel capacitor 13 is fabricated similarly to capacitor 11, except that a thinner, typically 80 Å, oxide 97 separates a second n-doped region 92 from floating gate 12. In a preferred embodiment, first and second n-doped regions 91, 92 are doped to the same concentration.

The configuration cell performs four operations: PROGRAM, ERASE, VERIFY and READ. Programming the cell involves placing charge on the common floating gate. To program the cell, a voltage of Vpp (typically 12 volts) is applied to write line 80, a voltage of Vpp (typically 12 volts) is applied to write select node 84, a voltage of Vcc (typically 5 volts) is applied to verify select node 74, and GND (typically 0 volts) is applied to the control gate 10, voltage node 40, voltage node 50 and verify line 70. This causes electrons to tunnel across the tunnel oxide from floating gate 12 to node 14.

Applying a voltage greater than or equal to Vpp, typically 14 volts, to write select node 84 turns on transistor 82, therefore the voltage at write node 14 becomes the voltage at write line 80 (Vpp), typically 12 volts in the present embodiment. Thus, the voltage at write node 14 becomes 12 volts. The drains 32, 22 of transistors 30 and 20 are pulled to GND in the present embodiment, because transistor 72 has been turned on. Moreover, the sources of transistors 20, 30 are at 0 V, because a voltage of GND has been applied to voltage nodes 40, 50. This causes electrons to tunnel across the thin tunnel oxide 97 of tunnel capacitor 13 from the floating gate 12, thereby charging the cell.

To erase the charge stored on the floating gate, a voltage of GND is applied to write line 80, Vcc is applied to write select node 84, verify select line 74, and verify node 70, and a voltage of Vpp is applied to control gate 10, voltage node 40 and voltage node 50. This causes electrons to tunnel across the tunnel oxide 97 to the floating gate 12 from node 14.

Applying a voltage of Vcc to write select node 84 turns on transistor 82, and causes the voltage at write node 14 to drop to approximately 0 volt. Because a high voltage of Vcc or Vpp is applied at the remaining nodes 10, 40, 50, 70 and 74, electrons tunnel in the reverse direction across the thin tunnel oxide of tunnel capacitor 13 to floating gate 12 from write node 14, thereby placing negative charge on the floating gate.

To read the EEcell, a voltage of $V_{cc}/2$—approximately 2.5 V in the present embodiment—is applied to write line 80 and control gate 10. A voltage of $V_{cc}$ is applied to write select node 84 and voltage node 40, and GND is applied to voltage node 50 and verify select node 74. Transistor 82 is turned on, therefore the voltage at write node 14 becomes approximately Vcc/2. The voltage at control gate 10 is also Vcc/2. These values are selected so that the voltage applied across tunnel capacitor 13 is zero to avoid a floating gate read disturb condition. The desired condition is such that when negative charge is stored on floating gate 12 the output 60 becomes Vcc. When positive charge is stored on floating gate 12, output 60 becomes GND. This causes data to appear at output node 60, as follows. When positive charge is stored on floating gate 12, n-channel MOSFET 20 is turned on, p-channel MOSFET 30 is turned off and output 60 goes to a low state (0 V). When negative charge is stored at floating gate 12, n-channel MOSFET 20 is turned off, p-channel MOSFET 30 is turned on, and output 60 is pulled up to Vcc. Thus, output 60 is able to swing from rail to rail, that is, between Vcc and ground. Moreover, except when switching between states, the cell consumes very low power, because one of the two MOSFETs is always turned off, breaking the current path from node 40 to node 50.

To verify the amount of charge stored on floating gate 12, a margin voltage between GND and Vcc, $V_{cc}/2$ in a preferred embodiment, is applied to write line 80 and control gate 10, Vcc is applied to write select node 84 and voltage node 40, GND is applied to voltage node 50, and Vcc is applied to verify select node 74 of the cell to be interrogated and data appears at verify line 70. The VERIFY operation functions in the same way as the READ operation, except that transistor 72 is turned on, thereby coupling the output 60 to the verify line 70.

In one embodiment, an adequately charged cell should retain its charge for at least ten years. To ensure that the cell has been adequately charged and has retained its charge, the cell is margin verified. The nominal bias condition for the EEcell is a voltage of VCC/2, typically 2.5 V, applied to control gate 10. To margin verify the EEcell, the cell is interrogated under bias conditions that will cause a poorly charged cell to fail. In margin verify mode, the voltage applied to control gate 10 is raised as high as 5.5 V or lowered as low as 0 V. A properly charged cell will produce a correct output even under these conditions; however, a poorly charged cell or a cell with inadequate charge retention will fail.

It will be understood that the particular embodiments described above are only illustrative of the principles of the present invention, and that various modifications could be made by those skilled in the art without departing from the scope and spirit of the present invention, which is limited only by the claims that follow.

What is claimed is:

1. In a programmable logic device, a configuration cell comprising:
   a common floating gate;
   an output node;
   a write node;
   a control gate;
   a p-channel MOS device with a source coupled to a first voltage, a drain coupled to said output node, and a gate coupled to said common floating gate;
   an n-channel MOS device with a drain coupled to said output node and to said drain of said p-channel MOS device, a source coupled to a second voltage, a gate coupled to said common floating gate, said MOS devices being coupled together such that in a steady state, only one of said MOS devices conducts;
   a tunnel capacitor, for providing charge to and removing charge from said common floating gate, having its first terminal coupled to said common floating gate and its other terminal coupled to said write node; and
   a capacitor having its first terminal coupled to said common floating gate and its other terminal coupled to said control gate.

2. The configuration cell of claim 1 wherein one of said first and second voltage sources is set to a voltage representing a logical low state and the other voltage source is set to a voltage representing a logical high state, such that the voltage at said output node varies unambiguously between a first one of said logical low state and said logical high state and a second one of said logical low state and said logical high state as said common floating gate varies between a charged state and a discharged state.

3. A configuration cell comprising:
   a common floating gate;
   an output node;
   a write node;
   a control gate;
   a capacitor for storing charge, having its first terminal coupled to said control gate and its second terminal coupled to said common floating gate;
   a tunnel capacitor for charging and discharging said common floating gate, having its first terminal coupled to said write node and its second terminal coupled to said common floating gate;
   an n-channel MOS device having its source coupled to a first voltage node, its substrate coupled to said source, and its drain coupled to said output node and said common floating gate disposed over the channel between the source and the drain; and
   a p-channel MOS device having its source coupled to a second voltage node, its substrate coupled to said source, its drain coupled to said output node and to said drain of said n-channel MOS device, and said common floating gate disposed over the channel between the source and the drain, said MOS devices being coupled such that in a steady state, only one of said MOS devices conducts.

4. The device of claim 3 wherein a first pass transistor having a write select signal coupled to its gate couples said write node to an external write line, and a second pass transistor having a verify signal coupled to its gate couples said output node to an external verify line.

5. The configuration cell of claim 3 wherein one of said first and second voltage nodes is set to a voltage representing a logical low state and the other voltage node is set to a voltage representing a logical high state, such that the voltage at said output node varies unambiguously between a first one of said logical low state and said logical high state and a second one of said logical low state and said logical high state as said common floating gate varies between a charged state and a discharged state.

6. In a programmable logic device, a configuration cell comprising:
   a control gate;
   a storage node;
   a write node;
   an output node;
   a p-channel MOSFET with its source connected to a first voltage, its drain connected to said output node, and its gate connected to said storage node;
   an n-channel MOSFET with its drain connected to said output node and to said drain of said p-channel MOSFET, its source connected to a second voltage and its gate connected to said storage node, said MOSFETS being coupled such that in a steady state, only one of said MOSFETS conducts;
   a tunnel capacitor, for providing and removing charge from said storage node, having its first terminal connected to said storage node and its other terminal connected to said write node; and
   a capacitor for storing charge, having its first terminal connected to said storage node and its other terminal connected to said control gate.

7. The configuration cell of claim 6 wherein one of said first and second voltages is set to a voltage representing a logical low state and the other voltage is set to a voltage representing a logical high state, such that the voltage at said output node varies unambiguously between a first one of said logical low state and said logical high state and a second one of said logical low state and said logical high state as said storage node varies between a charged state and a discharged state.

8. A configuration cell comprising:
- a storage node;
- an output node;
- a control gate;
- a write node;
- a write select node;
- a write line;
- a verify line;
- a verify select node;
- a CMOS invertor having its input coupled to said storage node and its output coupled to said output node, said invertor being configured such that substantially no power is consumed during normal operation;
- a capacitor having a first terminal coupled to said storage node and a second terminal coupled to said control gate;
- a tunnel capacitor having a first terminal coupled to said storage node and a second terminal coupled to said write node;
- a first pass transistor having a drain coupled to said write node, a gate coupled to said write select node and a source coupled to said write line; and
- a second pass transistor having a source coupled to said verify line, a gate coupled to said verify select node, and a drain coupled to said output node.

9. The configuration cell of claim 8 wherein said invertor is further coupled to first and second voltage nodes where one of said voltage nodes is set to a voltage representing a logical low state and the other voltage node is set to a voltage representing a logical high state, such that the voltage at said output node varies unambiguously between a first one of said logical low state and said logical high state and a second one of said logical low state and said logical high state as said storage node varies between a charged state and a discharged state.

10. A configuration cell comprising:
- floating gate means for storing charge;
- programming means including a tunnel capacitor for charging and discharging the floating gate; and
- means for sensing the charge on the floating gate and providing an amplified output representative of the charge and consuming an amount of power approaching zero.

11. The configuration cell of claim 10 wherein the programming means includes a pass transistor gated by a write select signal for coupling inputs to said tunnel capacitor from a write node.

12. The configuration cell of claim 11 wherein the means for sensing the charge on the floating gate and providing an amplified output representative of the charge comprises a CMOS invertor.

13. The configuration cell of claim 12 wherein the output means includes a pass transistor gated by a verify select signal for coupling the output of the CMOS invertor to a verify node.

14. The configuration cell of claim 13 including means for verifying a voltage margin.

15. The configuration cell of claim 10 wherein said means for sensing is coupled to first and second voltage supply means where one of said voltage supply means is set to a voltage representing a logical low state and the other voltage supply means is set to a voltage representing a logical high state, such that said amplified output representative of the charge varies unambiguously between a first one of said logical low state and said logical high state and a second one of said logical low state and said logical high state as said floating gate varies between a charged state and a discharged state.

* * * * *

UNITED STATES PATENT AND TRADEMARK OFFICE
CERTIFICATE OF CORRECTION

PATENT NO. : 5,272,368
DATED : December 21, 1993
INVENTOR(S) : John E. Turner and Richard G. Cliff It is certified that error appears in the above-indentified patent and that said Letters Patent is hereby corrected as shown below:

Column  Line 4    31   "select line 74" should be -- select node 74 --.

4    32   "verify node 70" should be -- verify line 70 --.

Signed and Sealed this

Twenty-ninth Day of November, 1994

Attest:

BRUCE LEHMAN

Attesting Officer        Commissioner of Patents and Trademarks